United States Patent
Donzè et al.

(10) Patent No.: US 7,869,269 B2
(45) Date of Patent: Jan. 11, 2011

(54) PHASE-CHANGE MEMORY DEVICE WITH ERROR CORRECTION CAPABILITY

(75) Inventors: Enzo Michele Donzè, San Giuseppe Jato (IT); Ferdinando Bedeschi, Monza (IT); Meenatchi Jagasivamani, Folsom, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 294 days.

(21) Appl. No.: 12/209,967

(22) Filed: Sep. 12, 2008

(65) Prior Publication Data

US 2009/0109738 A1 Apr. 30, 2009

(30) Foreign Application Priority Data

Sep. 13, 2007 (EP) ................................. 07425569

(51) Int. Cl.
*G11C 11/00* (2006.01)
(52) U.S. Cl. .............. 365/163; 365/189.14; 365/185.09
(58) Field of Classification Search .................. 365/163, 365/189.14, 185.09
See application file for complete search history.

(56) References Cited

U.S. PATENT DOCUMENTS

| | | | | |
|---|---|---|---|---|
| 7,304,877 | B2* | 12/2007 | Ko et al. ................ | 365/230.03 |
| 2005/0055621 | A1 | 3/2005 | Adelmann et al. | |
| 2008/0094869 | A1* | 4/2008 | Osada et al. .................. | 365/51 |

FOREIGN PATENT DOCUMENTS

EP 1 708 202 A2 10/2006

* cited by examiner

*Primary Examiner*—Tuan T. Nguyen
(74) *Attorney, Agent, or Firm*—Lisa K. Jorgenson; Robert Iannucci; Seed IP Law Group PLLC

(57) ABSTRACT

A phase-change memory device includes a plurality of data PCM cells for storing data bits; data decoding circuits for selectively addressing sets of data PCM cells; and data read/program circuits for reading and programming the selected data PCM cells. The device further includes a plurality of parity PCM cells for storing parity bits associated with data bits stored in the data PCM cells; parity decoding circuits for selectively addressing sets of parity PCM cells; and parity read/program circuits for reading and programming the selected parity PCM cells.

24 Claims, 5 Drawing Sheets

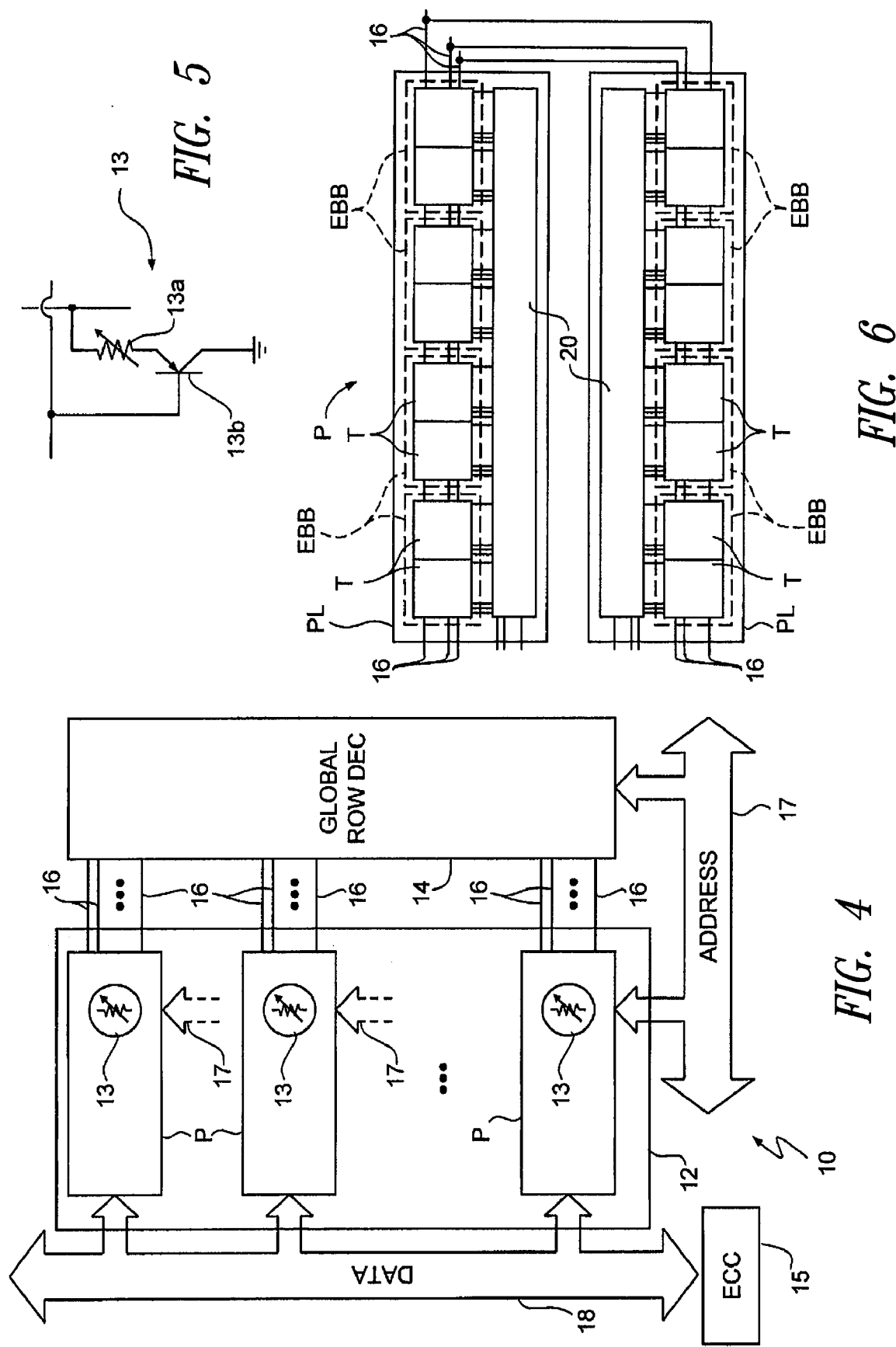

PHASE-CHANGE MEMORY DEVICE WITH ERROR CORRECTION CAPABILITY

CROSS-REFERENCE TO RELATED APPLICATION

This application claims the benefit under 35 U.S.C. §119 (a) of European Patent Application No. 07425569, filed on Sep. 13, 2007, which is incorporated by reference in its entirety.

BACKGROUND

1. Technical Field

The present invention relates to a phase-change memory device with error correction capability.

2. Description of the Related Art

As is known, phase-change memory arrays use a class of materials which have the property of changing between two phases having distinct electrical characteristics. For example, these materials may change from an amorphous phase, which is disorderly, to a crystalline or polycrystalline phase, which is orderly, and the two phases are associated to considerably different values of resistivity.

At present, alloys of elements of group VI of the periodic table, such as Te or Se, referred to as chalcogenides or chalcogenic materials, can advantageously be used in phase-change cells. The chalcogenide that currently offers the most promise is formed by a Ge, Sb and Te alloy (Ge2Sb2Te5) and is widely used for storing information in overwritable disks.

In chalcogenides, the resistivity varies by two or more orders of magnitude when the material passes from the amorphous phase (more resistive) to the crystalline phase (more conductive) and vice versa. The characteristics of the chalcogenides in the two phases are shown in FIG. 1. As may be noted, at a given read voltage, here designated by Vr, there is a variation in resistance of more than 10.

Phase change may be obtained by locally increasing the temperature, as shown in FIG. 2. Below 150° C. both phases are stable. Above 200° C. (nucleation starting temperature Tx), there takes place fast nucleation of the crystallites, and, if the material is kept at the crystallization temperature for a sufficient length of time (time t2), it changes its phase and becomes crystalline. To bring the chalcogenide back into the amorphous state, it is necessary to raise the temperature above the melting temperature Tm (approximately 600° C.) and then to cool the chalcogenide off rapidly (time t1).

From the electrical standpoint, it is possible to reach both critical temperatures, namely the crystallization temperature and the melting point, by causing a current to flow through a resistive element which heats the chalcogenic material by Joule effect.

The basic structure of a phase-change storage element 1 which operates according to the principles described above is shown in FIG. 3 and comprises a resistive element 2 (heater) and a programmable element 3. The programmable element 3 is made with a chalcogenide and is normally in the crystalline state in order to enable a good flow of current. One part of the programmable element 3 is in direct contact with the resistive element 2 and forms a phase-change portion 4.

If an electric current having an appropriate value is caused to flow through the resistive element 2, it is possible to heat the phase-change portion 4 selectively up to the crystallization temperature or to the melting temperature and to cause phase change.

The state of the chalcogenic material can be measured by applying a sufficiently small voltage, such as not to cause a sensible heating, and then reading the current flowing. Since the current is proportional to the conductivity of the chalcogenide, it is possible to discriminate the state of the chalcogenide.

Of course, the chalcogenide can be electrically switched between different intermediate states, thus affording the possibility of obtaining a multilevel memory.

In practice, a phase-change storage element 1 can be considered as a resistor which conducts a different current according to its phase. In particular, the following convention is adopted: a phase-change storage element is defined as "set" when, once appropriately biased, it conducts a detectable current (this condition may be associated to a logic condition "1"), and as "reset" when, in the same biasing conditions, it does not conduct current or conducts a much lower current than a cell that is set (logic condition "0").

The use of phase-change storage elements has already been proposed in memory arrays formed by a plurality of memory cells arranged in rows and columns. In order to prevent the memory cells from being affected by noise caused by adjacent memory cells, generally each memory cell comprises a phase-change storage element of the type described above and a selection element (such as an MOS transistor or a diode), coupled to the phase-change storage element.

Nevertheless, read and program errors may occur, on account of a number of events that anyway affect array currents and read/program circuits either temporarily or permanently (such as noise, temperature gradients, external electromagnetic fields, local damages and the like).

It would be therefore advisable to implement measures to improve reliability of read and program operations of phase change memory arrays and to reduce errors. Such measures should also comply with general requirements, that are widely felt in the field of microelectronic industry. In particular requirements to minimize device dimensions and power consumption and to simplify array design and layout should be satisfied.

BRIEF SUMMARY

One embodiment is a phase-change memory device that allows to overcome the limitations described.

One embodiment is a phase-change memory device that includes a plurality of data PCM cells configured to store data bits; data decoding circuits structured to selectively address sets of the data PCM cells; and data read/program circuits configured to read and program the sets of the data PCM cells. In addition the device includes a plurality of parity PCM cells configured to store parity bits associated with data bits stored in the data PCM cells; parity decoding circuits configured to selectively address sets of the parity PCM cells; and parity read/program circuits configured to read and program the sets of the parity PCM cells.

BRIEF DESCRIPTION OF THE SEVERAL VIEWS OF THE DRAWINGS

For the understanding of the present invention, a preferred embodiment thereof will be now described, purely as non-limitative example, with reference to the enclosed drawings, wherein:

FIG. 4 shows a simplified block diagram of a phase-change memory device according to one embodiment;

FIG. 5 is an electric diagram of a phase-change memory cell incorporated in the phase-change memory device of FIG. 4;

FIG. 6 is a more detailed block diagram of a portion of the phase-change memory device of FIG. 4;

DETAILED DESCRIPTION

Figure 1:
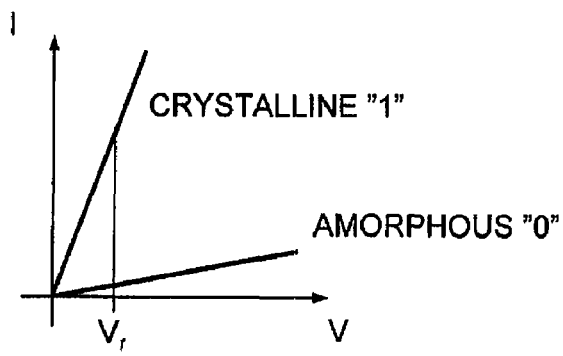
FIG. 1 shows the current-versus-voltage characteristic of a phase-change material.
Figure 2:
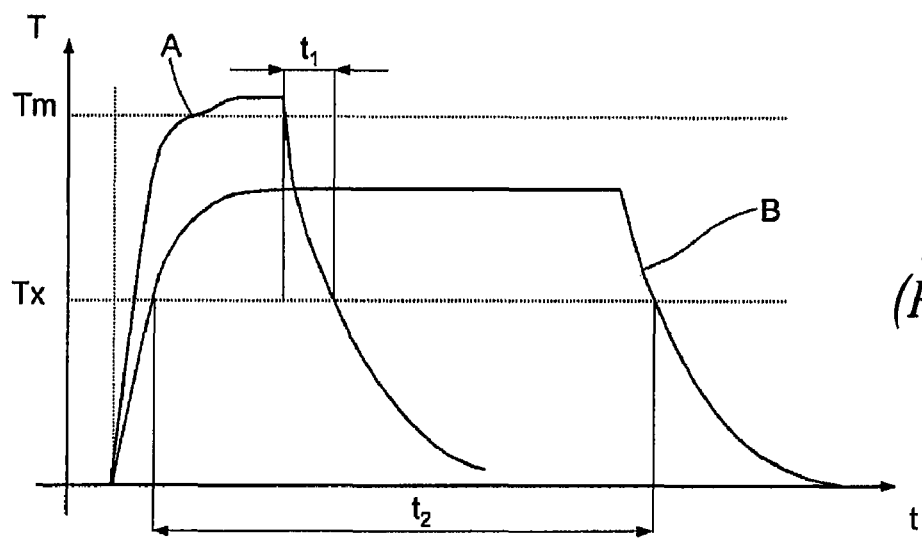
FIG. 2 shows the temperature-versus-current plot of a phase-change material.
Figure 3:
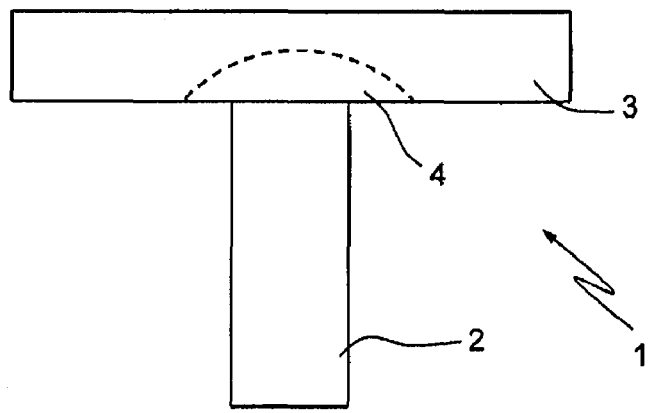
FIG. 3 shows the basic structure of a phase-change storage element.

With reference to FIG. 4, a phase-change memory device 10 comprises an array 12 of data PCM cells 13, arranged in rows and columns, and is provided with a global row decoder circuit 14 and an error correction module (ECC) 15. Data PCM cells 13 are organized in a plurality of partitions P, that are structurally identical to one another. Partitions P are connected to the global row decoder circuit 14 by respective sets of global word lines 16, one of which is selectively addressed by the global row decoder circuit 14. A group of respective local word lines (not illustrated in FIG. 4) is associated with each global word line 16. Read/program circuits and column decoding circuits are included in each partition P and are not shown in FIG. 4, for simplicity.

An address bus 17 provides the global row decoder circuit 14 and partitions P with addresses of data PCM cells 13 to be read or programmed during read and program operations, respectively. A data bus 18 is coupled to the partitions P to collect read data from data PCM cells 13 and to provide data to be stored in data PCM cells 13 during read and program operations, respectively.

Data stored in the array 12 are encoded according to a known Error Correction Code and therefore include parity bits, as explained later on. Data retrieved from the array 12 are sent to the error correction module 15 over the data bus 18. The error correction module 15 is configured to restore one error in a page of read data (one bit out of 128 in the embodiment herein described, as will be seen).

FIG. 5 illustrates one exemplary data PCM cell 13 of the array 12. All data PCM cells 13 are identical and include a phase-change memory element 13a and a selector 13b coupled in series thereto. The phase-change memory element 13a includes a portion of a phase-change material and is therefore suitable for storing data in form of respective resistance levels associated with different phases of the phase-change material, as above explained. In FIG. 5, the phase-change memory element 13a is illustrated as a resistor having variable resistance level. In the embodiment herein described, the selectors 13b are PNP bipolar transistors controlled to allow currents flow through selected memory elements 13a during read and program operations.

As shown in FIG. 6, data PCM cells 13 of each partition P are further organized in planes PL and in tiles T. More precisely, each partition P comprises two planes PL and a number M of tiles T (M/2 tiles T in each plane PL). In the embodiment herein described, the number M of tiles T in each partition P is 16. Tiles T of each plane PL are aligned along a row direction and are grouped in pairs, to form M/2 elementary building blocks EBB of the array 12 in each partition P. Tiles T of the same elementary building block EBB also belong to the same plane PL. Tiles T of different planes PL are aligned in pairs along a column direction, perpendicular to the row direction.

Tiles T of the same partition P share a set of global word lines 16.

Read/program stages 20 are associated with cells of each partition P.

Figure 7:
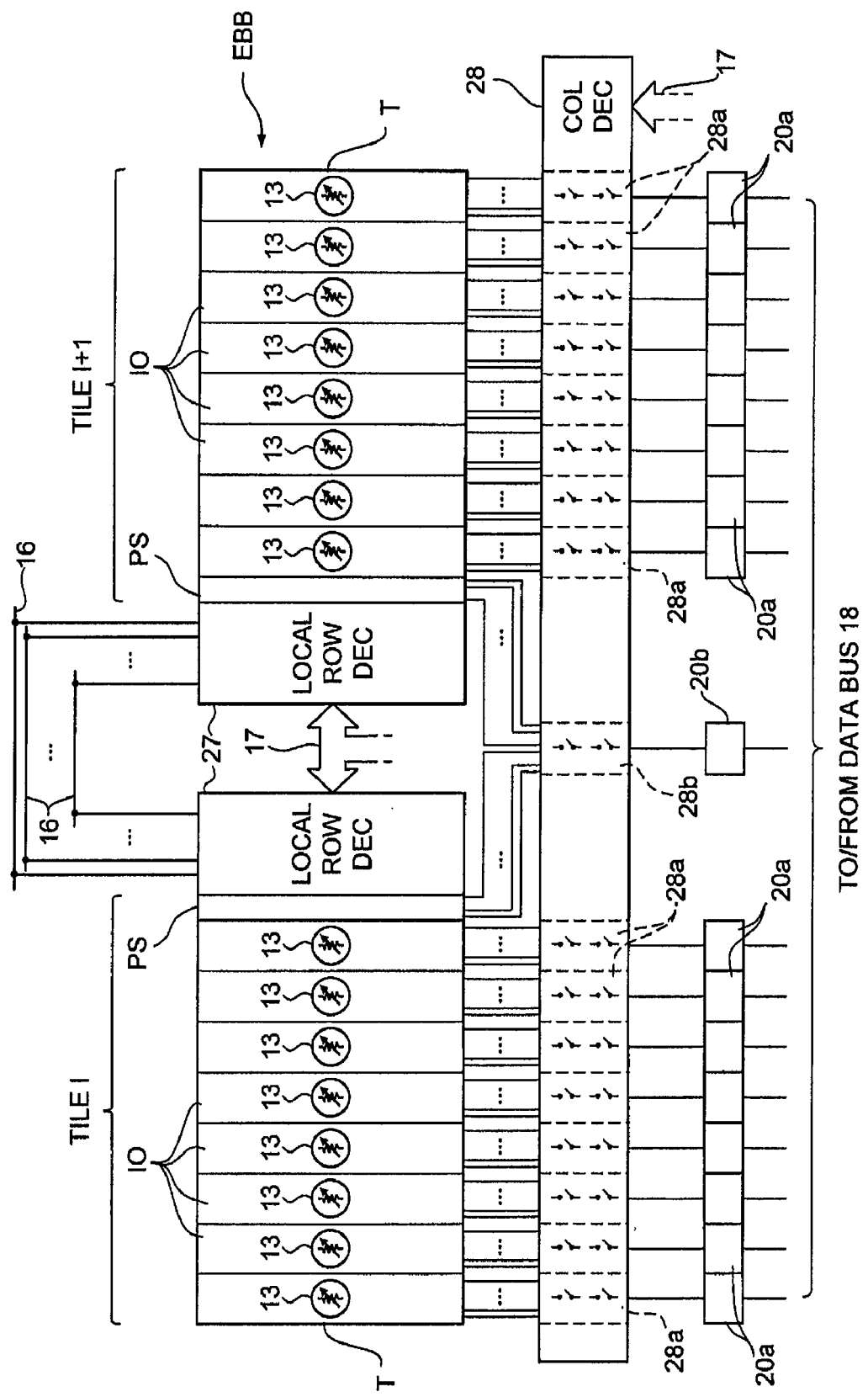
FIG. 7 is a more detailed block diagram of a particular of FIG. 6.
Figure 8:
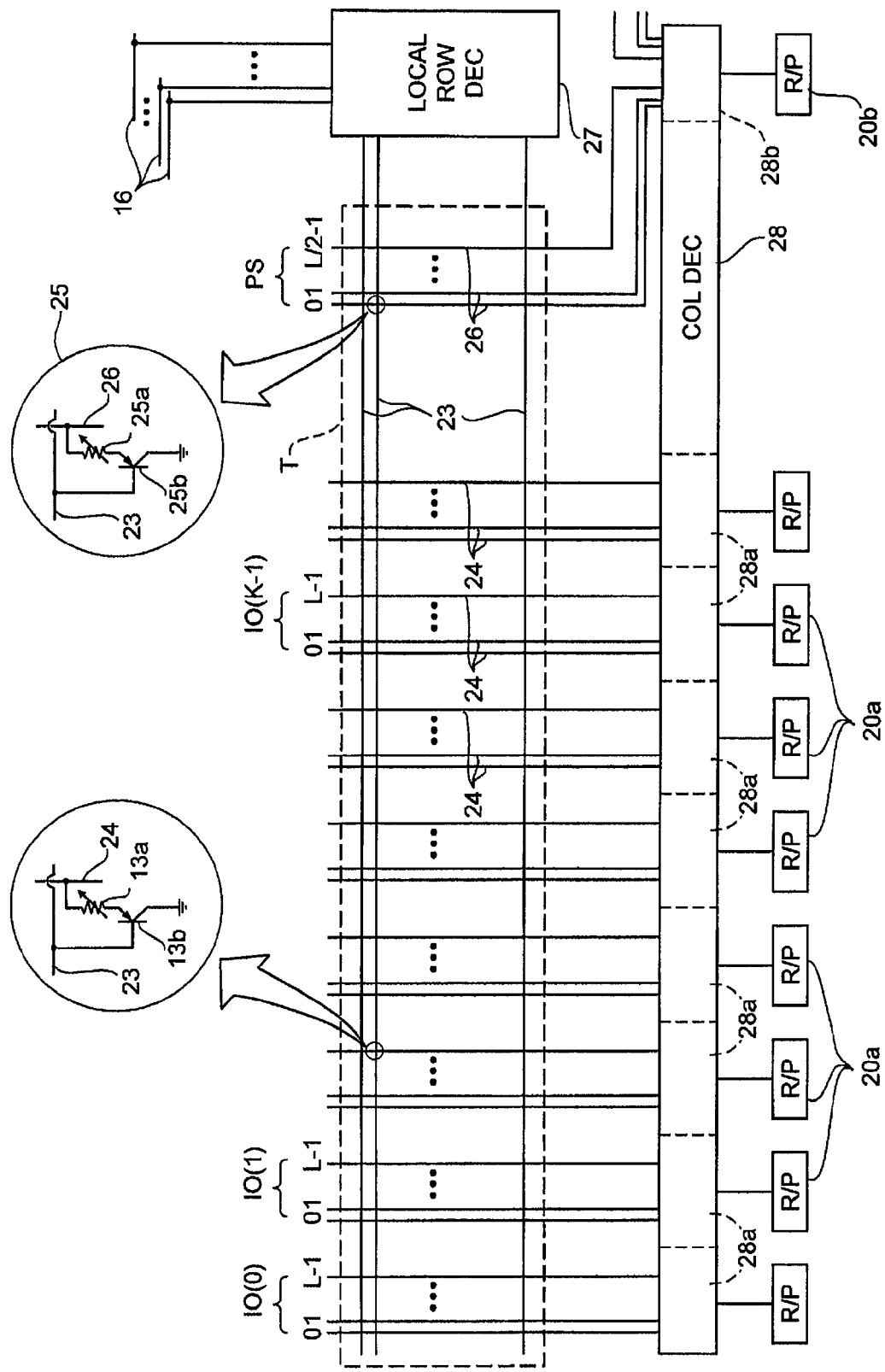
FIG. 8 is a more detailed block diagram of a particular of FIG. 7.

The structure of tiles T will be now illustrated in detail with reference to FIGS. 7 and 8. FIG. 7 shows a pair of adjacent tiles T, that form an elementary building block EBB of the array 12 and may be replicated to form partitions P as required by design specifications. FIG. 8 shows a single tile T.

Each tile T (FIG. 8) includes N×N data PCM cells 13, N local word lines 23 and N (local) data bit lines 24 (N=1024, in the example herein described). A group of respective local word lines 23 is associated with each global word line 16. Tiles T further comprise respective sets of parity PCM cells 25, for storing parity bits associated with data stored in corresponding data PCM cells 13. Parity PCM cells 25 have the same structure as data PCM cells 13 (including a PCM element 25a and a selector 25b) and are arranged in parity sections PS, one in each tile T. Each parity PCM cell 25 is connected to a respective local word line 23 and to a respective parity bit line 26 (FIG. 7).

One local row decoder circuit 27 and one column decoder circuit 28 are associated with each tile T, for selectively connecting one local word line 23 to the respective global word line 16 and for selectively connecting groups of data bit lines 24 and one parity bit line 26 to the respective read/program stages 20, that comprise respective data read/program circuits 20a and parity read/program circuits 20b.

More precisely, K data read/program circuits 20a are dedicated to each tile T, and L=1024/K respective adjacent data bit lines 24 are associated with each data read/program circuit 20a (K=8 and L=128 in the embodiment herein described, see also FIG. 8). Tiles T are therefore logically divided into K groups IO and one data bit line 24 in each group IO may be selected for read/program operations by a respective data decoding section 28a the column decoder circuit 28 (e.g., the I-th data bit line 24 in each group IO). In FIG. 8, groups IO are accompanied with a progressive number 0, 1, . . . , K−1, in parenthesis. Hence, K data PCM cells 13 in each tile T may be simultaneously read, thus leading to an output page of K×M bit read in a single read operation (in the embodiment described, M'K=128). Due to technological limitations, however, normally only one cell in each tile T is selected for program operation, because higher currents are used.

Each parity section PS also comprises respective (L/2)×N parity PCM cells 25 (64×1024 in the present embodiment) and L/2 parity bit lines 26 (L/2=64). Hence, in each parity section PS there are half as many cells and bit lines as in each group IO. Parity bit lines 26 are adjacent to one another and the parity section PS is adjacent to one external group IO of the respective tile T. Moreover, parity sections PS are arranged between the data PCM cells 13 of the two tiles T in the same elementary building block EBB.

As shown in FIG. 7, an additional parity read/program circuit 20b is shared by the two tiles T forming the same elementary building block EBB and is used for reading and programming the parity PCM cells 25 of the parity sections PS. Since each of the parity sections has half as many bit lines as groups IO, a single shared parity read/program circuit 20b, identical to data read/program circuits 20a, may be used to read and program parity PCM cells 25 in two adjacent tiles T and a single parity decoding section 28b of the column decoder circuit may be used to address parity bit lines 26 to be connected to the parity read/program circuit 20b. Parity decoding sections 28b are moreover identical to data decoding section 28a.

As already mentioned, the phase-change memory device 10 is readable by memory pages of K×M bits from one partition P, where K is the number of data read/program circuits 20a associated with each tile T and M is the number of tiles T in each partition P. In the embodiment described, in particular, K×M=128, since K=8 and M=16.

In addition, one parity PCM cell 25 every two tiles T may be addressed and read, so that M/2 parity bits may be associated with each memory page. Hence, correction of one bit in each memory page is available and most reading and programming errors may be corrected.

Data PCM cells 13 and parity PCM cells 25 may be read simultaneously, thereby providing low access time without appreciably increasing reading noise. It is known that word line leakage is a source of noise and depends on the number of cells that are simultaneously selected on a single local word line 23. In the phase-change memory device 10, only one additional parity PCM cell 25 is selected on an addressed local word line 23. Thus, noise caused by word line leakage is not significantly modified.

Also program operation is very fast, because up to M/2 (i.e., eight) parity bits may be simultaneously written in corresponding parity PCM cells 25 of a single partition P. The maximum number of cells of a single tile T that may be simultaneously programmed is normally limited to one by power consumption. In fact, comparatively high currents are used to cause phase transitions and increasing the number of simultaneously programmed cells may lead to damages. However, parity sections PS are distributed between all the tiles T of each partition P, namely the two tiles T of each elementary building block EBB share circuitry used to store one parity bit (parity PCM cells 25, parity bit lines 26 and one additional parity read/program circuit 20b). Thus, M/2 different tiles are involved in programming as many parity PCM cells 25 and programming may be carried out in a single step.

Sharing one parity read/program circuit 20b between two parity sections of two tiles T in the same elementary building block EBB provides design simplicity, flexibility and small device size. On the one side, in fact, the elementary building blocks EBB may be replicated without any substantial electrical, topological or physical variations (except possibly symmetry: by way of example, elementary building blocks EBB in different planes PL of the same partition P may be specular with respect to one another; however, electrical structure, number and types of components and internal electric connections are unchanged). Moreover, all read/program circuits 20a, 20b are identical, as well as data decoding sections 28a and parity decoding sections 28b of the column decoder circuit 28. Thus, implementing error correction capability does not entail design of special components. On the other side, parity read/program circuits 20b and parity decoding sections 28b of the column decoder circuit 28 are shared between tiles T of the same elementary block EBB so as to be fully exploited. Device area is therefore minimized, in relation to improved error correction capability.

Figure 9:
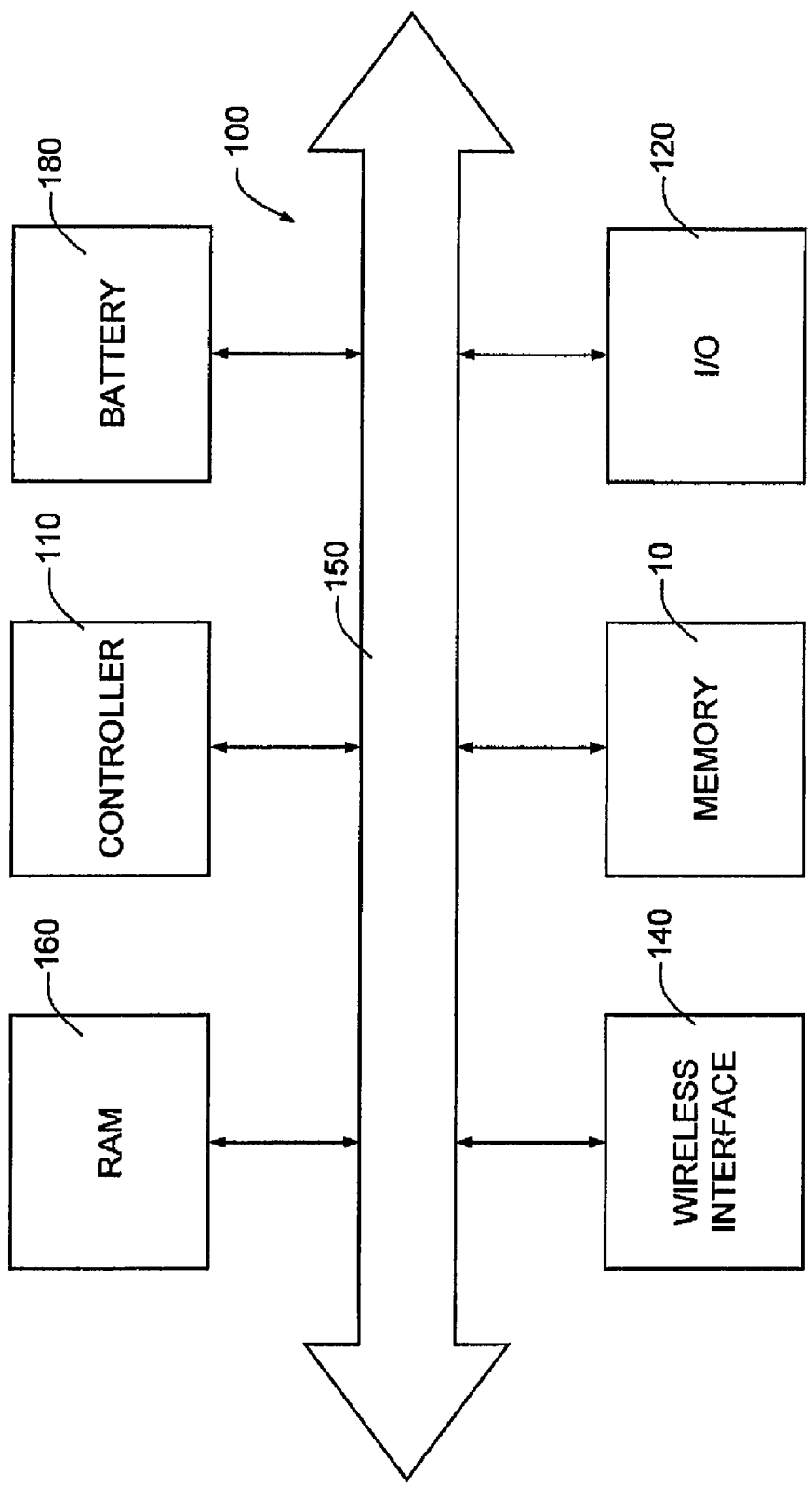
FIG. 9 is a system depiction of one embodiment.

In FIG. 9, a portion of a system 100 in accordance with an embodiment of the present invention is illustrated. System 100 may be used in devices such as, for example, a personal digital assistant (PDA), a laptop or portable computer, possibly with wireless capability, a cell phone, a messaging device, a digital music player, a digital camera, or other devices that may be adapted to process, store, transmit or receive information and require permanent storage capability.

System 100 may include a controller 110, an input/output (I/O) device 120 (e.g., a keyboard, display), the phase-change memory device 10, a wireless interface 140, and a RAM memory 160, coupled to each other via a bus 150. A battery 180 may be used to supply power to the system 100 in one embodiment. It should be noted that the scope of the present invention is not limited to embodiments having necessarily any or all of above listed components.

Controller 110 may comprise, for example, one or more microprocessors, digital signal processors, micro-controllers, or the like.

The I/O device 120 may be used to generate a message. The system 100 may use the wireless interface 140 to transmit and receive messages to and from a wireless communication network with a radio frequency (RF) signal. Examples of the wireless interface 140 may include an antenna, or a wireless transceiver, such as a dipole antenna, although the scope of the present invention is not limited in this respect. Also, the I/O device 120 may deliver a voltage reflecting what is stored as either a digital output (if digital information was stored), or as analog information (if analog information was stored).

Finally, it is clear that numerous modifications and variations may be made to the device described and illustrated herein, all falling within the scope of the invention. In particular, the number of tiles T in each partition P, the number of data reading circuits 20a associated to each tile T and the number of data bit lines 26 in each group IO may change with respect to those described above.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A phase-change memory device, comprising:
a plurality of data PCM cells configured to store data bits;
data decoding circuits structured to selectively address sets of the data PCM cells;
data read/program circuits configured to read and program the sets of the data PCM cells;
a plurality of parity PCM cells configured to store parity bits associated with data bits stored in the data PCM cells;
parity decoding circuits configured to selectively address sets of the parity PCM cells; and
parity read/program circuits configured to read and program the sets of the parity PCM cells.

2. A device according to claim 1 wherein the data PCM cells and the parity PCM cells are organized in a plurality of tiles and each tile includes:
one of the sets of the data PCM cells;
one of the sets of the parity PCM cells;
a plurality of local word lines coupled to the set of data PCM cells and the set of parity PCM cells of the tile;
a plurality of data bit lines with data PCM cells connected thereto; and
a plurality of parity bit lines with parity PCM cells connected thereto.

3. A device according to claim 2 wherein the tiles are further organized in a plurality of elementary building blocks and each elementary building block comprises two respective adjacent tiles.

4. A device according to claim 3 wherein the elementary building blocks each comprise:
a respective one of the parity read/program circuits, wherein each parity read/program circuit is associated with parity bit lines of both tiles of the respective elementary building block; and
a respective one of the parity decoding circuits, wherein each parity decoding circuit is configured to address parity bit lines of both tiles of the respective elementary building block and to connect selected parity bit lines to the respective parity read/program circuit of the respective elementary building block.

5. A device according to claim 3 wherein all the elementary building blocks have identical electrical structure.

6. A device according to claim 3 wherein each elementary building block further includes a plural number of data read/program circuits for each tile of the elementary building block and the data read/program circuits of the elementary building block are respectively associated with respective groups of data bit lines of the respective tile.

7. A device according to claim 6 wherein parity bit lines associated with each tile are half as many as the data bit lines in each group of the tile.

8. A device according to claim 3 wherein the elementary building blocks further include respective local word line decoding portions of the data decoding circuits and of the parity decoding circuits.

9. A device according to claim 3 wherein the set of parity PCM cells of each tile of each elementary building block is arranged between the set of data PCM cells of the tile and the other tile of the elementary building block.

10. A device according to claim 3 wherein the elementary building blocks are further organized in a plurality of partitions, each partition including a plurality of planes, and each plane including a plurality of the elementary building blocks.

11. A device according to claim 1, comprising an error correction module coupled to the data and parity read/program circuits.

12. A system, comprising:
a processing unit;
an interface coupled to the processing unit; and
a phase-change memory device coupled to the processing unit, the memory device including:
a plurality of data PCM cells configured to store data bits;
data decoding circuits structured to selectively address sets of the data PCM cells;
data read/program circuits configured to read and program the sets of the data PCM cells;
a plurality of parity PCM cells configured to store parity bits associated with data bits stored in the data PCM cells;
parity decoding circuits configured to selectively address sets of the parity PCM cells; and
parity read/program circuits configured to read and program the sets of the parity PCM cells.

13. A system according to claim 12 wherein the data PCM cells and the parity PCM cells are organized in a plurality of tiles and each tile includes:
one of the sets of the data PCM cells;
one of the sets of the parity PCM cells;
a plurality of local word lines coupled to the set of data PCM cells and the set of parity PCM cells of the tile;
a plurality of data bit lines with data PCM cells connected thereto; and
a plurality of parity bit lines with parity PCM cells connected thereto.

14. A system according to claim 13 wherein the tiles are further organized in a plurality of elementary building blocks and each elementary building block comprises two respective adjacent tiles.

15. A system according to claim 14 wherein the elementary building blocks each comprise:
a respective one of the parity read/program circuits, wherein each parity read/program circuit is associated with parity bit lines of both tiles of the respective elementary building block; and
a respective one of the parity decoding circuits, wherein each parity decoding circuit is configured to address parity bit lines of both tiles of the respective elementary building block and to connect selected parity bit lines to the respective parity read/program circuit of the respective elementary building block.

16. A system according to claim 14 wherein each elementary building block further includes a plural number of data read/program circuits for each tile of the elementary building block and the data read/program circuits of the elementary building block are respectively associated with respective groups of data bit lines of the respective tile.

17. A system according to claim 14 wherein the elementary building blocks further include respective local word line decoding portions of the data decoding circuits and of the parity decoding circuits.

18. A system according to claim 14 wherein the set of parity PCM cells of each tile of each elementary building block is arranged between the set of data PCM cells of the tile and the other tile of the elementary building block.

19. A system according to claim 14 wherein the elementary building blocks are further organized in a plurality of partitions, each partition including a plurality of planes, and each plane including a plurality of the elementary building blocks.

20. A phase-change memory device, comprising:
a plurality of elementary building blocks each including:
respective first and second tiles, each tile including:
a plurality of sets of data PCM cells configured to store data bits;
a plurality of data decoding circuits coupled respectively to the sets of data PCM cells of the tile, each data decoding circuit being structured to selectively address the respective set of data PCM cells;
data read/program circuits configured to read and program the sets of data PCM cells of the tile, respectively; and
a set of parity PCM cells configured to store parity bits associated with data bits stored in the data PCM cells;
a parity decoding circuit configured to selectively address the sets of parity PCM cells of both tiles of the elementary building block; and
a parity read/program circuit configured to read and program the sets of parity PCM cells of both tiles of the elementary building block.

21. A device according to claim 20 wherein each tile includes:
a local row decoder; and
a plurality of local word lines coupling the local row decoder to the sets of data PCM cells and the set of parity PCM cells of the tile.

22. A device according to claim 20 wherein the set of parity PCM cells of each tile of each elementary building block is arranged between the set of data PCM cells of the tile and the other tile of the elementary building block.

23. A device according to claim 20 wherein the elementary building blocks are further organized in a plurality of partitions, each partition including a plurality of planes, and each plane including a plurality of the elementary building blocks.

24. A device according to claim 20, comprising an error correction module coupled to the data and parity read/program circuits.

* * * * *